(12) United States Patent
Lin et al.

(10) Patent No.: US 9,583,461 B2
(45) Date of Patent: Feb. 28, 2017

(54) PROBING CHIPS DURING PACKAGE FORMATION

(71) Applicant: Taiwan Semiconductor Manufacturing Company, Ltd., Hsin-Chu (TW)

(72) Inventors: Jing-Cheng Lin, Hsin-Chu (TW); Szu-Wei Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/685,167

(22) Filed: Apr. 13, 2015

(65) Prior Publication Data

US 2015/0214190 A1   Jul. 30, 2015

Related U.S. Application Data

(62) Division of application No. 13/429,054, filed on Mar. 23, 2012, now Pat. No. 9,006,004.

(51) Int. Cl.
*H01L 25/065* (2006.01)
*H01L 21/66* (2006.01)
(Continued)

(52) U.S. Cl.
CPC ...... *H01L 25/0655* (2013.01); *H01L 21/6835* (2013.01); *H01L 22/14* (2013.01); *H01L 23/3157* (2013.01); *H01L 23/49827* (2013.01); *H01L 23/49838* (2013.01); *H01L 24/92* (2013.01); *H01L 24/94* (2013.01); *H01L 24/97* (2013.01); *H01L 25/0652* (2013.01); *H01L 25/18* (2013.01); *H01L 25/50* (2013.01); *H01L 21/563* (2013.01); *H01L 2221/68345* (2013.01); *H01L 2224/11* (2013.01); *H01L 2224/11002* (2013.01); *H01L 2224/131* (2013.01); *H01L 2224/13124* (2013.01); *H01L 2224/13139* (2013.01); *H01L 2224/13144* (2013.01); *H01L 2224/13155* (2013.01); *H01L 2224/13184* (2013.01); *H01L 2224/1403* (2013.01); *H01L 2224/14181* (2013.01);
(Continued)

(58) Field of Classification Search
CPC ........... H01L 25/0655; H01L 23/49827; H01L 24/97; H01L 21/563
See application file for complete search history.

(56) References Cited

U.S. PATENT DOCUMENTS 4,811,082 A   3/1989 Jacobs et al.
4,990,462 A   2/1991 Sliwa, Jr.
(Continued)

FOREIGN PATENT DOCUMENTS

TW   201135879   10/2011

*Primary Examiner* — Tucker J Wright
(74) *Attorney, Agent, or Firm* — Slater Matsil, LLP

(57) ABSTRACT

A method includes bonding a first package component on a first surface of a second package component, and probing the first package component and the second package component from a second surface of the second package component. The step of probing is performed by probing through connectors on the second surface of the second package component. The connectors are coupled to the first package component. After the step of probing, a third package component is bonded on the first surface of the second package component.

18 Claims, 17 Drawing Sheets

(51) Int. Cl.
*H01L 23/00* (2006.01)
*H01L 21/683* (2006.01)
*H01L 25/00* (2006.01)
*H01L 23/31* (2006.01)
*H01L 23/498* (2006.01)
*H01L 25/18* (2006.01)
*H01L 21/56* (2006.01)

(52) U.S. Cl.
CPC ............... *H01L 2224/16145* (2013.01); *H01L 2224/16225* (2013.01); *H01L 2224/16238* (2013.01); *H01L 2224/1703* (2013.01); *H01L 2224/17181* (2013.01); *H01L 2224/32145* (2013.01); *H01L 2224/32225* (2013.01); *H01L 2224/73204* (2013.01); *H01L 2224/81* (2013.01); *H01L 2224/81005* (2013.01); *H01L 2224/81191* (2013.01); *H01L 2224/81801* (2013.01); *H01L 2224/81895* (2013.01); *H01L 2224/83* (2013.01); *H01L 2224/83104* (2013.01); *H01L 2224/9202* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06596* (2013.01); *H01L 2924/00012* (2013.01); *H01L 2924/00014* (2013.01); *H01L 2924/014* (2013.01); *H01L 2924/15311* (2013.01)

(56) References Cited

U.S. PATENT DOCUMENTS

| | | | |
|---|---|---|---|
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,655,504 B2 | 2/2010 | Mashino | |
| 7,834,450 B2 | 11/2010 | Kang | |
| 2008/0265434 A1* | 10/2008 | Kurita | H01L 21/563 257/777 |
| 2012/0018876 A1 | 1/2012 | Wu et al. | |
| 2012/0061853 A1* | 3/2012 | Su | H01L 21/563 257/778 |

* cited by examiner

PROBING CHIPS DURING PACKAGE FORMATION

PRIORITY CLAIM AND CROSS-REFERENCE

This application is a divisional of U.S. patent application Ser. No. 13/429,054, entitled "Probing Chips during Package Formation," filed on Mar. 23, 2012, which application is incorporated herein by reference.

BACKGROUND

Three-Dimensional Integrated Circuits (3DICs) are commonly used to break the barriers of Two-Dimensional (2D) circuits. In 3DICs, two or more package components are stacked, wherein the package components include interposers, package substrates, Printed Circuit Boards (PCBs), and the like. Through-Silicon Vias (TSVs) may be formed in some of the package components such as a device die and/or an interposer.

The 3DICs suffer from various problems that may cause the loss in the manufacturing yield. For example, the connectors used for bonding two package components may crack. The connectors may also delaminate from the respective package component. When the 3DICs comprise wafers, there may be severe warpage in the wafers, and the warpage may cause difficulty in the manufacturing process.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel three-dimensional integrated circuit (3DIC) package and the method of forming the same are provided. The intermediate stages of manufacturing an embodiment are illustrated. The variations of the embodiment are discussed. Throughout the various views and illustrative embodiments, like reference numbers are used to designate like elements.

Figure 1:
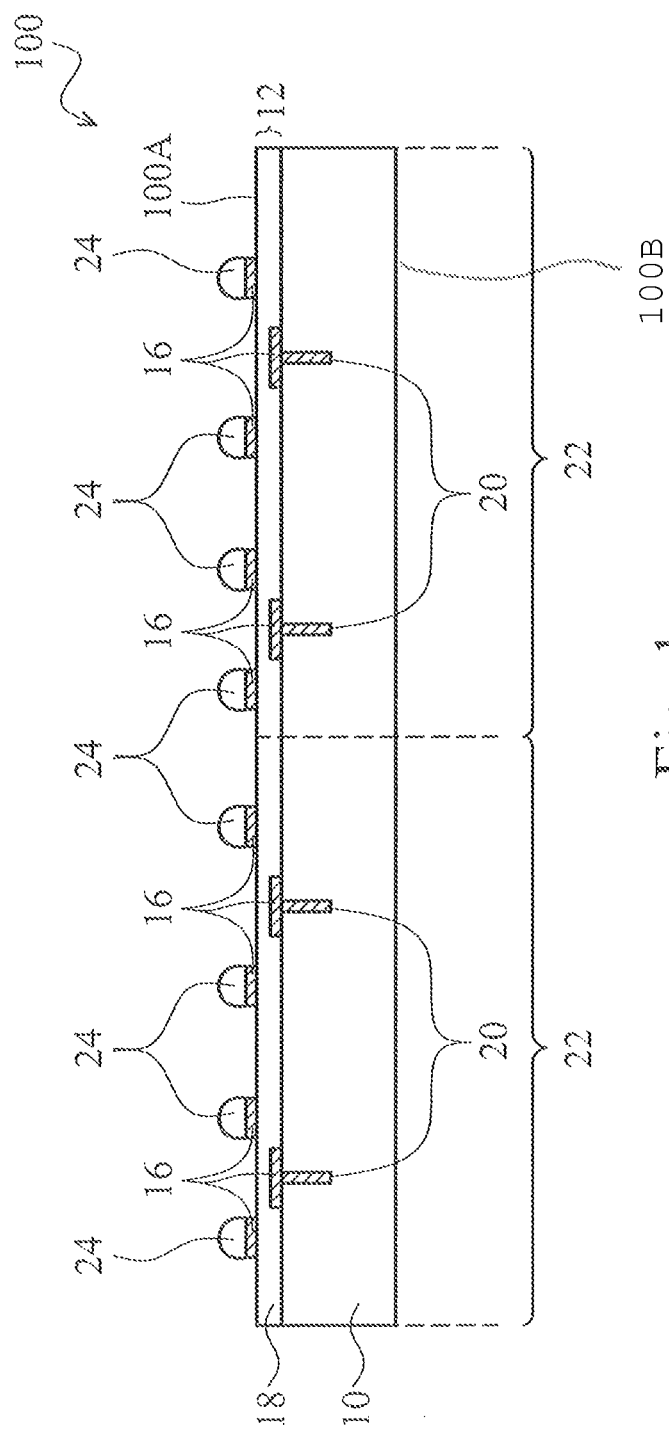
FIGS. 1 through 9 are cross-sectional views of intermediate stages in the manufacturing of a 3DIC package in accordance with various exemplary embodiments.

Referring to FIG. 1, package component 100 is provided. Package component 100 includes substrate 10. In some embodiments, package component 100 is an interposer wafer, which comprises a plurality of interposers 22. Package component 100 may be substantially free from integrated circuit devices, including active devices such as transistors. Furthermore, package component 100 may include, or may be free from, passive devices such as capacitors, resistors, inductors, varactors, and/or the like. Alternatively, package component 100 may be a device wafer that includes active devices such as transistors therein.

Substrate 10 may be formed of a semiconductor material such as silicon. Alternatively, substrate 10 may be formed of a dielectric material. Front-side interconnect structure 12 is formed on the front side of substrate 10. Interconnect structure 12 includes one or more dielectric layer(s) 18, and metal lines and vias 16 in dielectric layer(s) 18. Throughout the description, the side of package component 100 facing up in FIG. 1 is referred to as a front side, and surface 100A is referred to as a front surface. The side facing down is referred to as a backside of package component 100, and surface 100B is referred to as back surface 100B. Metal lines and vias 16 are alternatively referred to as front-side redistribution lines (RDLs). Further, through-substrate vias (TSVs) 20 are formed in substrate 10 and extend to a predetermined depth. TSVs 20 are electrically coupled to front-side RDLs 16.

Front-side connectors 24 are formed on front surface 100A of package component 100, and are electrically coupled to TSVs 20 through RDLs 16. In some embodiments, connectors 24 comprise solder balls. In alternative embodiments, connectors 24 comprise metal pads, metal pillars, metal pillars covered with solder caps, or the like.

Figure 2:
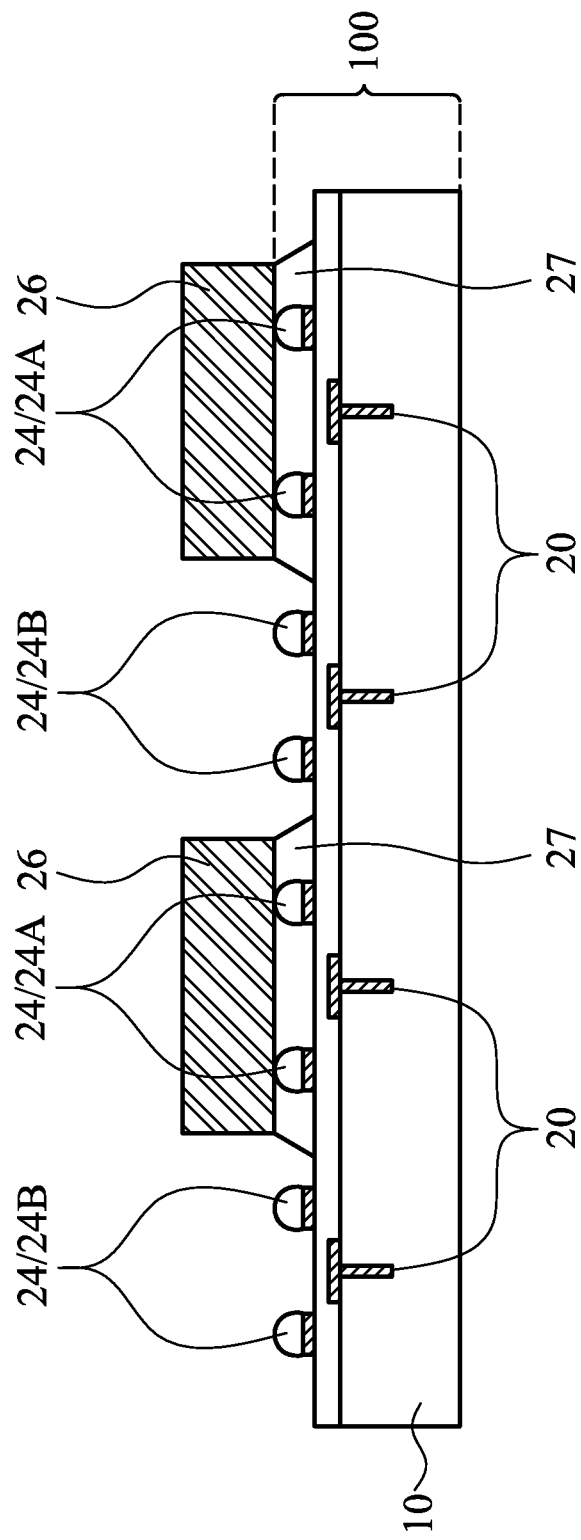

Referring to FIG. 2, package components 26 are bonded to the front side of package component 100, and bonded to connectors 24A, which are parts of connectors 24. In some embodiments, package components 26 are dies, and are referred to as dies 26 hereinafter, although they can also be of other types. Dies 26 may be device dies comprising integrated circuit devices, such as transistors, capacitors, inductors, resistors (not shown), and the like. Alternatively, dies 26 may be packages that include device dies and other package components such as interposers, package substrates, and the like, therein. The bonding between dies 26 and connectors 24A may be a solder bonding or a direct metal-to-metal (such as a copper-to-copper) bonding. Underfill regions 27 are dispensed into the gaps between dies 26 and package component 100, and are cured. Underfill regions 27 may be separate from each other.

Connectors 24 also include connectors 24B, wherein connectors 24A and 24B may have an identical structure, for example, with the same size, same layers, and the same material. No package component is bonded to connectors 24B, and hence connectors 24B are exposed, and are not covered by underfill regions.

Figure 3:
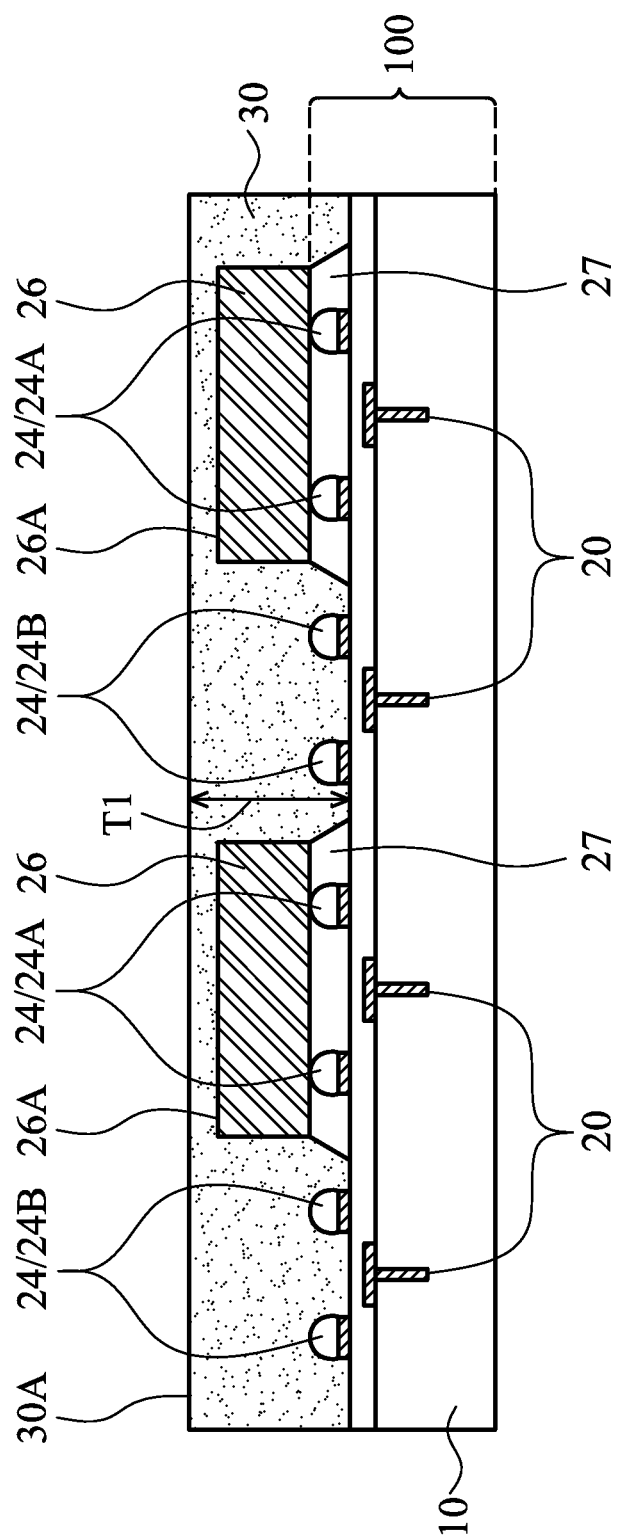

Referring to FIG. 3, film 30 is applied on dies 26 and package component 100. The top surface of film 30 may be higher than, level with, top surfaces 26A of dies 26. Film 30 is further filled into the gaps between dies 26. Film 30 may comprise a polymer, which may be removed later without damaging connectors 24B, dies 26, and package component 100. In some embodiments, film 30 is applied through spin-on coating. Alternatively, film 30 is laminated. The thickness T1 of film 30 may be greater than about 20 μm, and may be between about 20 μm and about 800 μm. Top surface 30A of film 30 may be substantially planar.

Figure 4:
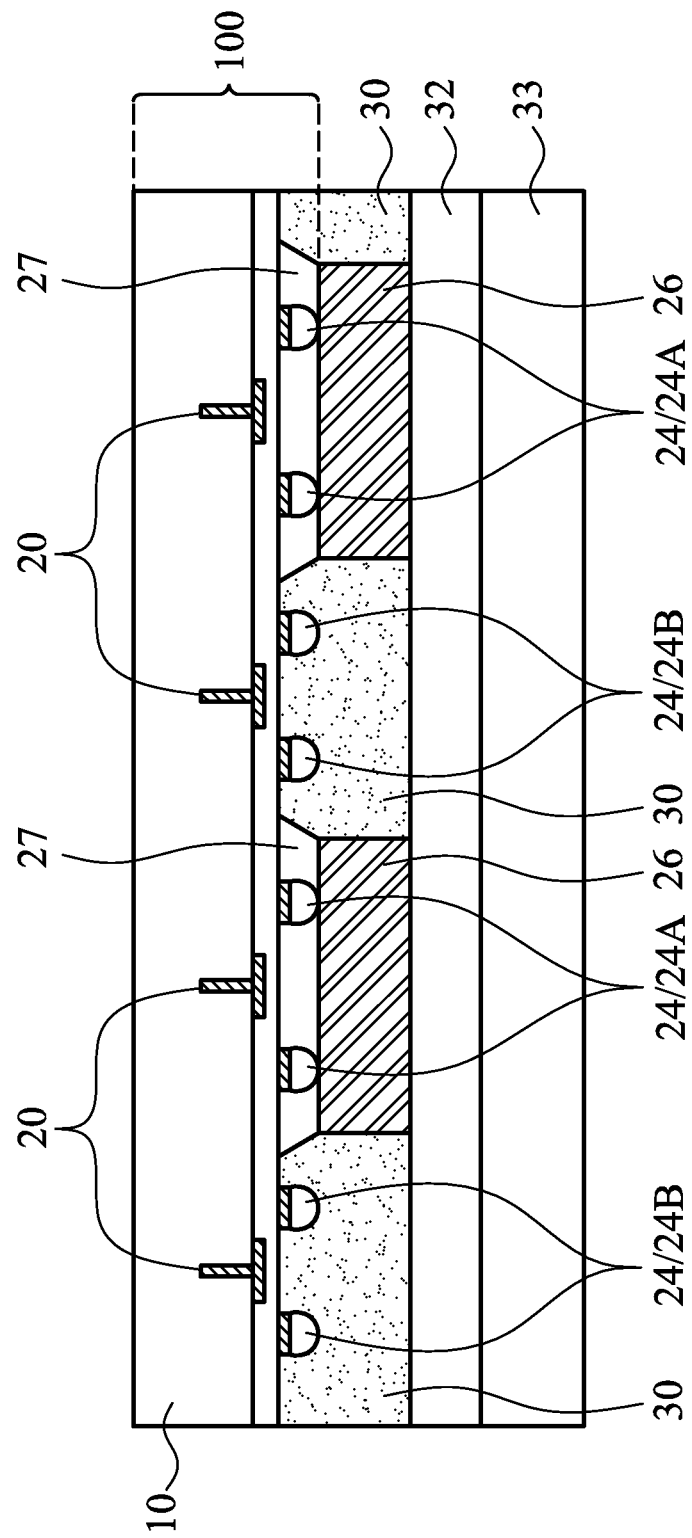

Referring to FIG. 4, package component 100 is mounted on carrier 33 through film 32. Film 32 may also comprise a polymer. In some exemplary embodiments, film 32 may be a Ultra-Violet (UV) glue, or may be formed of other polymer materials. Film 32 may be formed of a material that is removable by etching. Carrier 33 may be a glass carrier, although other types of carriers may also be used.

Figure 5:
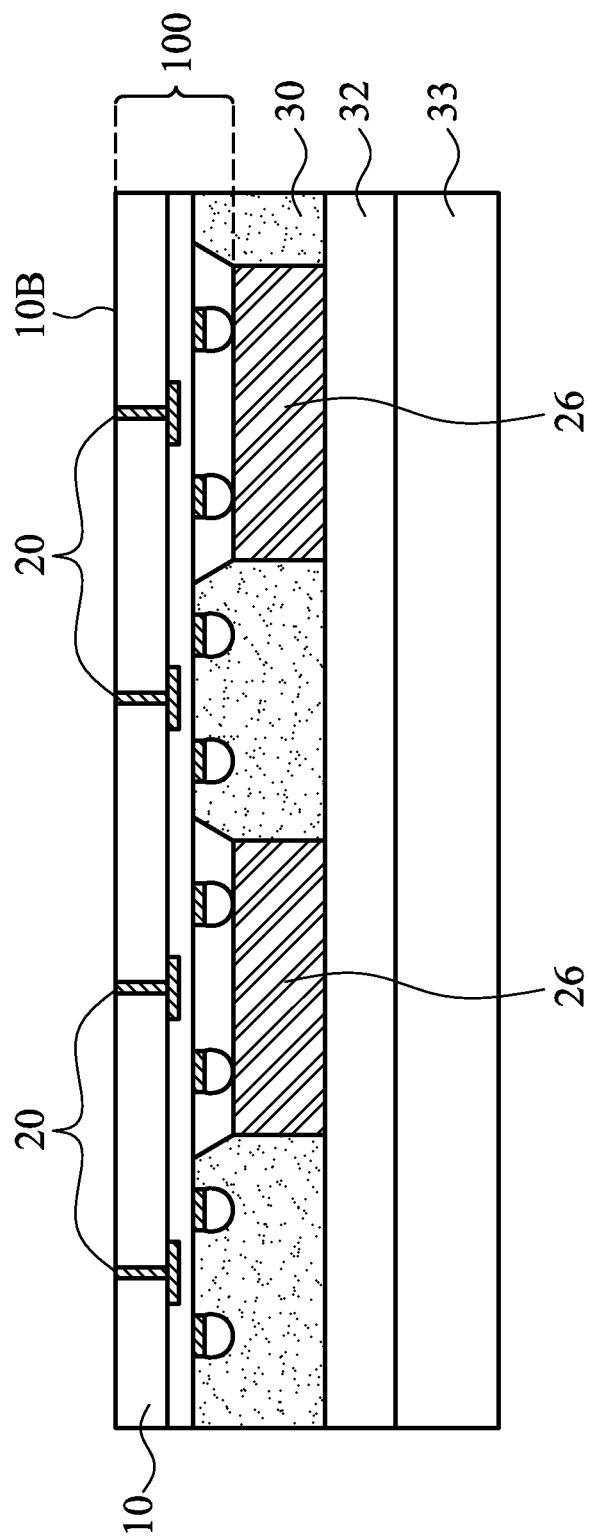
Figure 6:
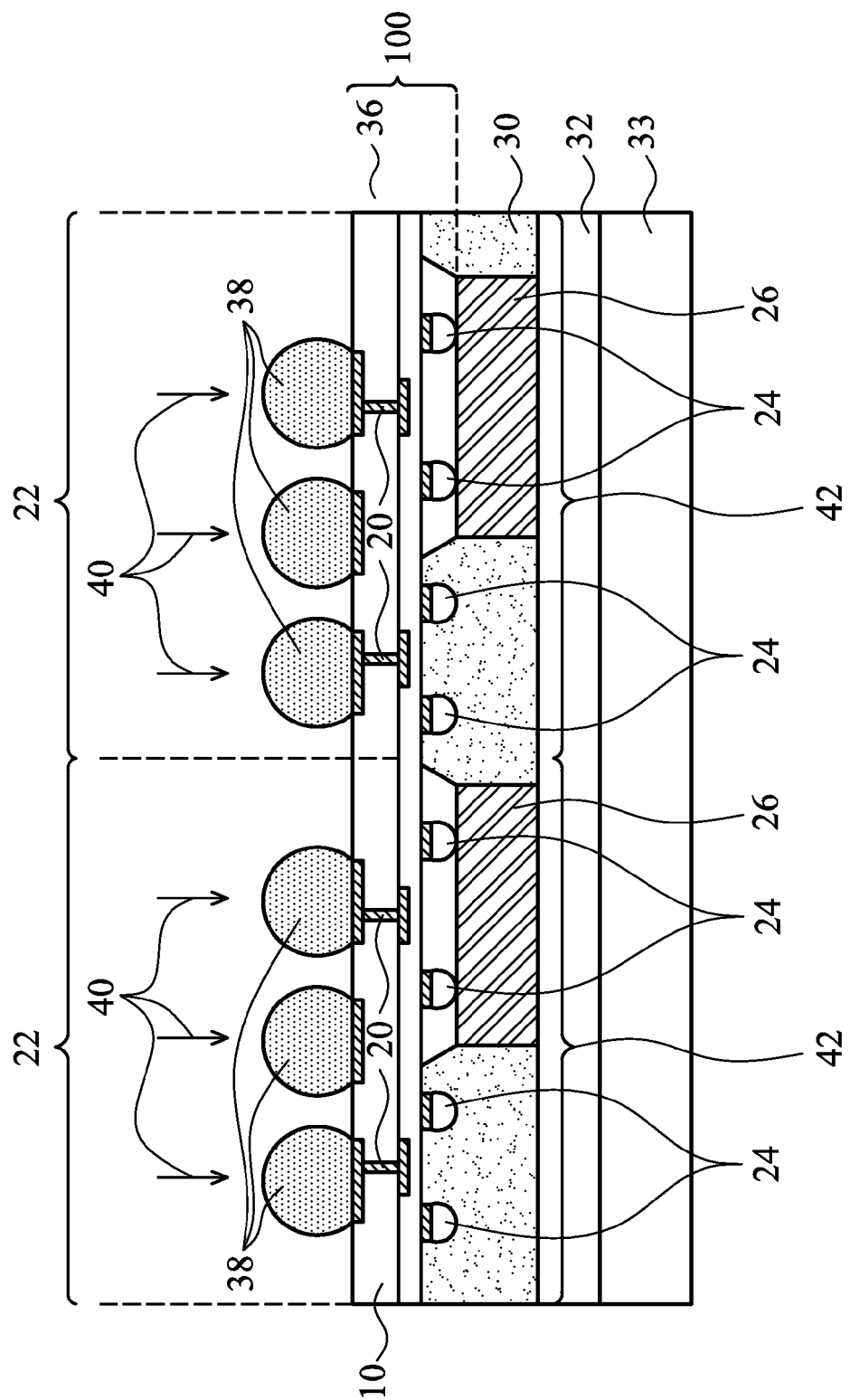

Referring to FIG. 5, a wafer backside grinding is performed to thin substrate 10 from the backside of package component 100, until TSVs 20 are exposed. An etch may be performed to further reduce the surface of substrate 10, so that TSVs 20 protrude out of the back surface 10B of the remaining portion of substrate 10. Next, as shown in FIG. 6, backside interconnect structure 36 is formed to connect to TSVs 20. In various embodiments, backside interconnect structure 36 may have a structure similar to front-side interconnect structure 12, and may include one or more layers of redistribution lines (RDLs, not shown). Connectors 38 are then formed, and are electrically coupled to backside interconnect structure 36. Through backside interconnect structure 36 and TSVs 20, connectors 38 may be electrically coupled to dies 26 and connectors 24. Connectors 38 may be solder-containing connectors. Connectors 38 may also include solder balls, solder caps on metal pillars, metal pillars, metal pads, or other types of metal bumps formed of gold, silver, nickel, tungsten, aluminum, and/or alloys thereof. Throughout the description, interposers 22 (not marked in FIG. 6, please refer to FIG. 1) in package component 100 and the respective dies 26 in combination are referred to as packages 42. Accordingly, as shown in FIG. 6, a plurality of packages 42 is formed.

FIG. 6 also illustrates the probing of package component 100 and dies 26 through connectors 38, wherein arrows 40 represent the probe pins that are used for the probing. It is realized that dies 26 may be known-good-dies when they are bonded onto package component 100. Additional defects, however, may be introduced, for example, in the electrical paths between dies 26 and connectors 38. In addition, dies 26 may also be damaged during the bonding process. Some of packages 42 may pass the probe test, and are marked as good packages, while some other packages 42 may not pass the probe test, and hence are marked as defective packages. Therefore, through the probing, the good packages 42 and defective packages 42 may be identified.

Figure 7:
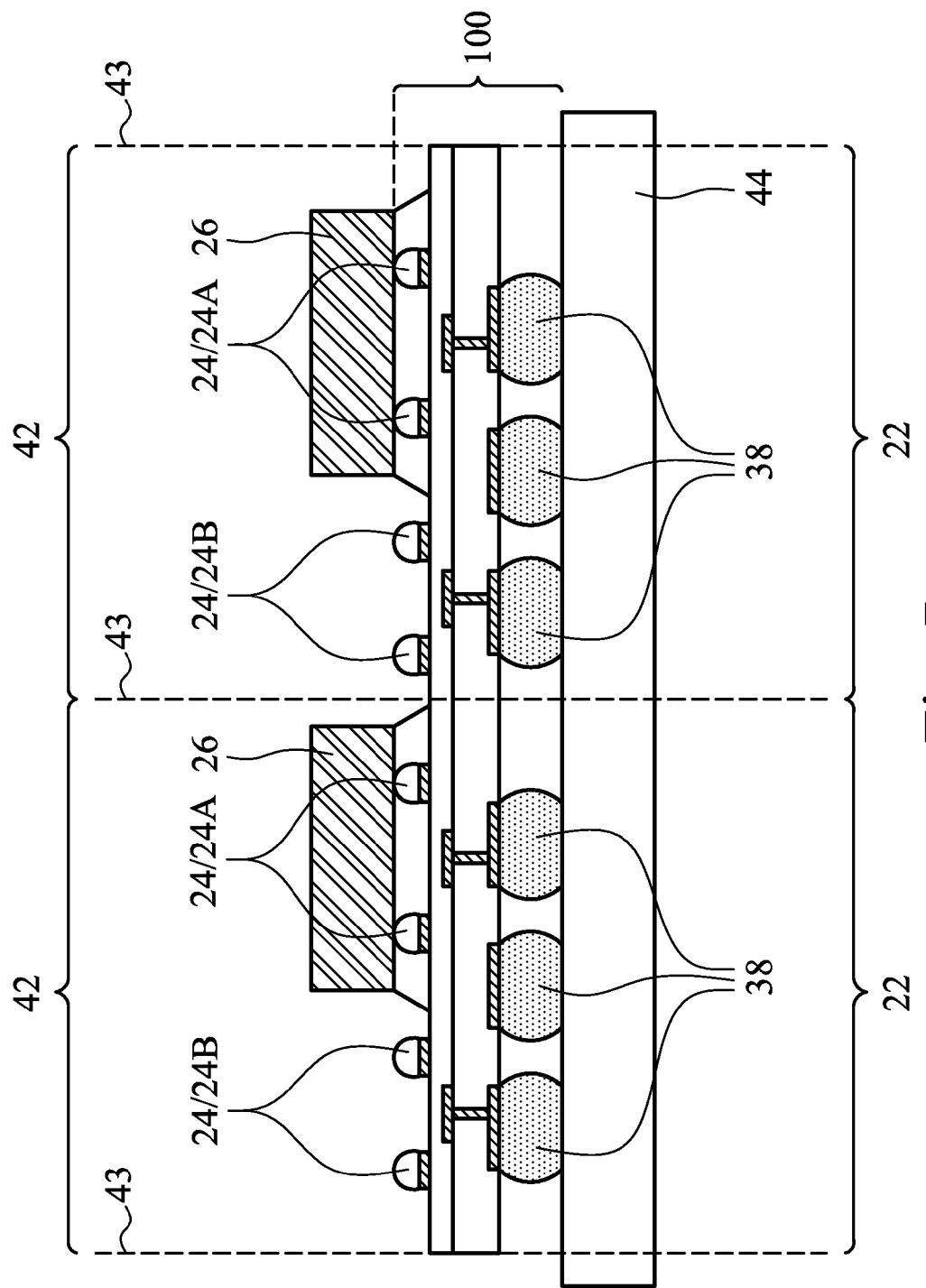

Carrier 33 is then de-bonded, for example, by exposing film 32 to a UV light, causing it to lose its adhesive property. The resulting structure is shown in FIG. 7. Film 32 is removed, for example, by etching. Film 30 is also removed. In some exemplary embodiments, film 32 may be peeled off. Connectors 24B are thus exposed. Dicing tape 44 is adhered to the same side of package component 100 as the side connectors 38 are located, and is used to de-bond carrier 33. Next, a dicing is performed along scribe lines 43 to separate packages 42 from each other. Each of the resulting packages 42 includes one interposer 22 and one or more die 26.

Figure 8:
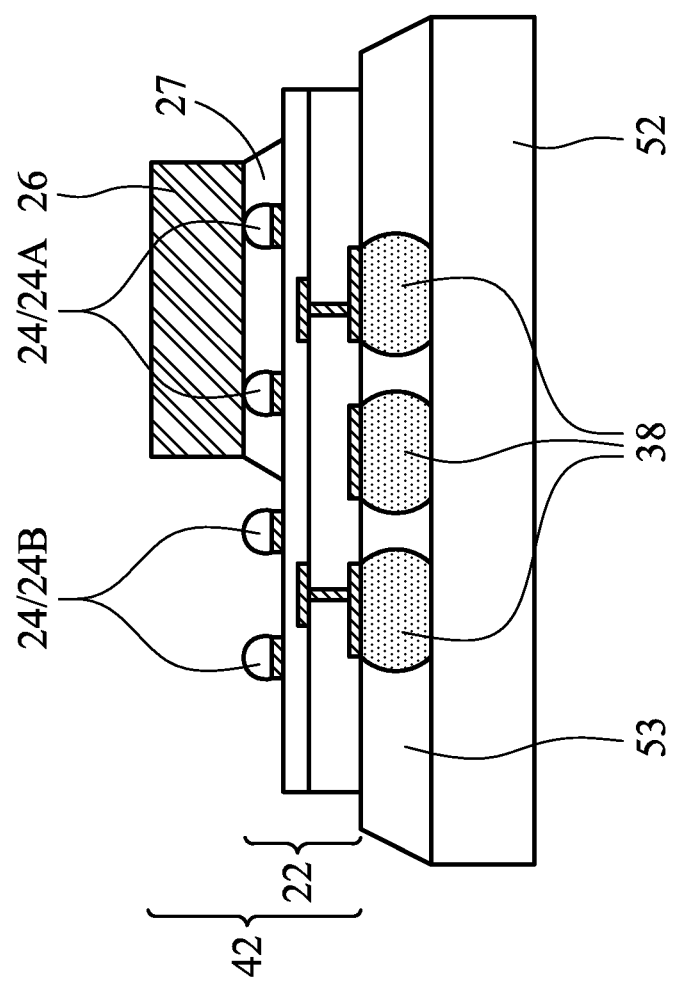

Referring to FIG. 8, the resulting good package 42 may be bonded to another package component such as package substrate 52 through connectors 38. Underfill region 53 may then be applied between package 42 and package component 52.

Referring back to FIG. 6, in the probing step, the defective packages 42 are identified and are discarded. Therefore, no defective package 42 will be bonded to package component 52. It is realized that defective packages 42 are detected in an early stage before the packaging is finished. It is thus possible to prevent further package components such as package substrates, dies, etc. to be bonded to the defective packages. The further yield loss resulted from the defective packages is thus eliminated.

Figure 9:
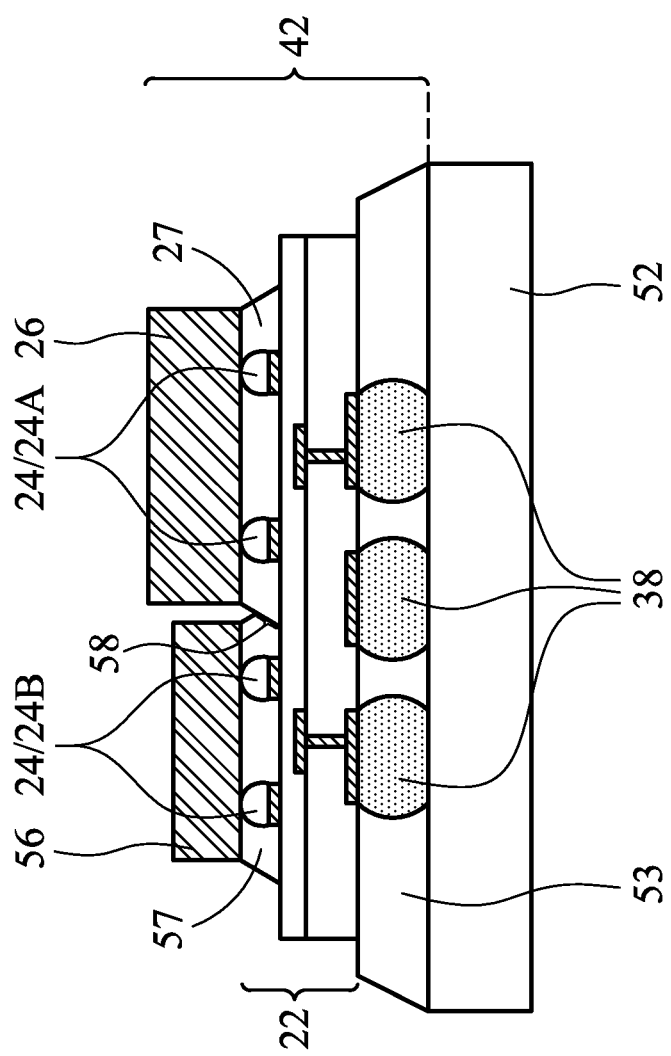

FIG. 9 illustrates the bonding of package component 56 on package 42, which is a good package. Package component 56 may be a device die, and hence is alternatively referred to as die 56 hereinafter, although it may be of another type of package component such as a package. Die 56 is bonded to connectors 24B. After the bonding, die 56 may be electrically coupled to TSVs 20 and connectors 38. In some embodiments, dies 26 and 56 are of a same type, and have an identical structure. In alternative embodiments, dies 26 and 56 are of different types, and have different structures. Underfill 57 is then dispensed and cured. When dies 26 and 56 are close to each other, underfill regions 57 and 27 may join each other to form a continuous underfill region. It is realized that underfill regions 57 and 27 are dispensed at different time points. Therefore, regardless of whether underfill regions 57 and 27 are formed of a same material or comprise different materials, visible interface 58 may be formed between underfill regions 57 and 27 when underfill regions 57 and 27 are in contact with each other. Alternatively, underfill regions 57 and 27 may be disconnected from each other.

Figure 10:
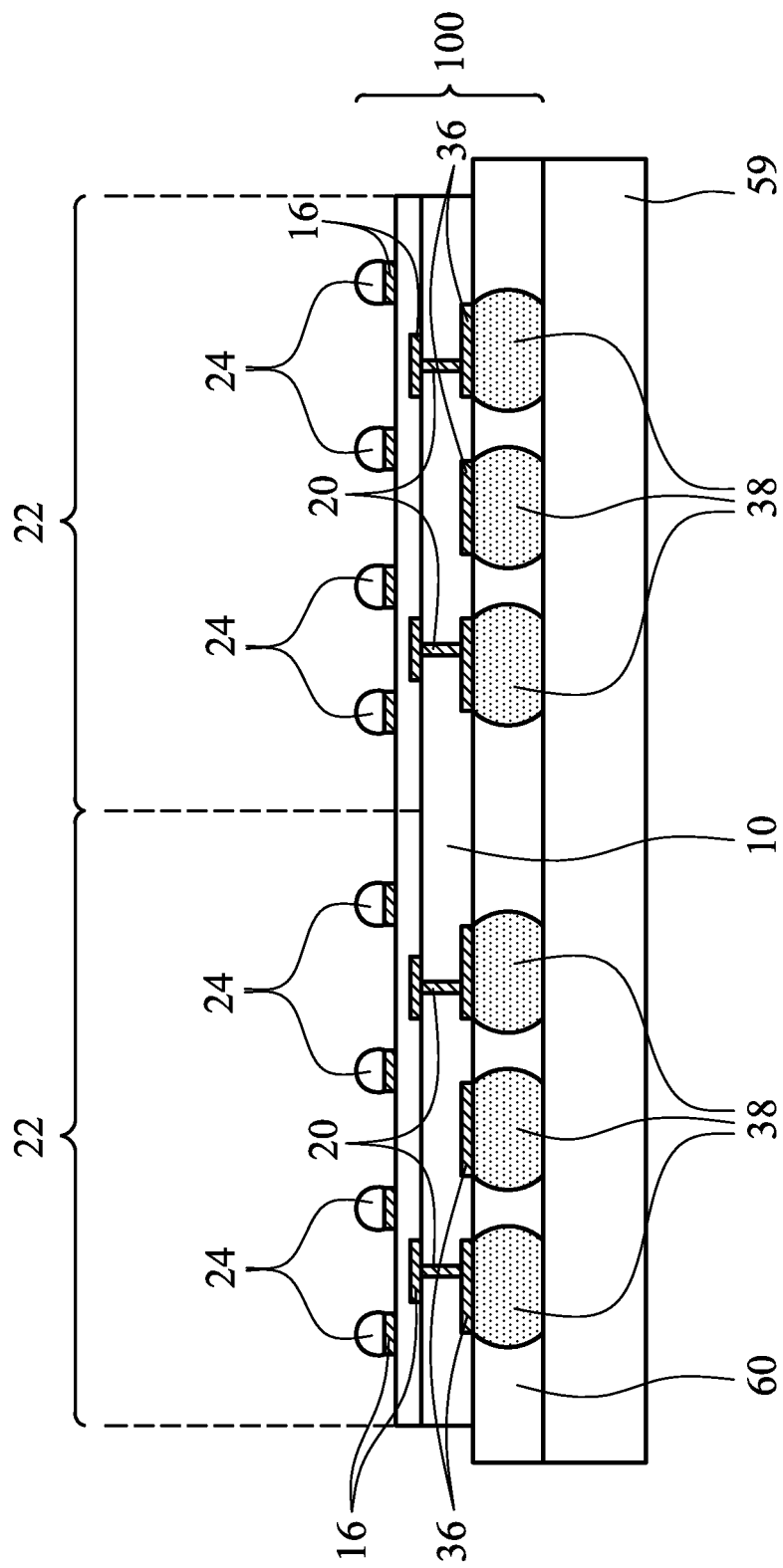
FIGS. 10 through 17 are cross-sectional views of intermediate stages in the manufacturing of a 3DIC package in accordance with various alternative exemplary embodiments.

FIGS. 10 through 15 illustrate cross-sectional views of intermediate stages in the manufacturing of a package in accordance with alternative embodiments. Unless specified otherwise, the reference numerals in these embodiments represent like elements in the embodiments illustrated in FIGS. 1 through 9. The respective details, for example, regarding the formation methods and the materials of the elements are not repeated, and may be found referring to the embodiments of FIGS. 1 through 9. Referring to FIG. 10, package component 100 is provided, and is attached to carrier 59, for example, through adhesive 60, which may be a UV glue in an exemplary embodiment. Backside interconnect structure 36 and connectors 38 are also pre-formed, and may be electrically coupled to connectors 24 through TSVs 20 and RDLs 16. Carrier 59 may be a glass carrier.

Figure 11:
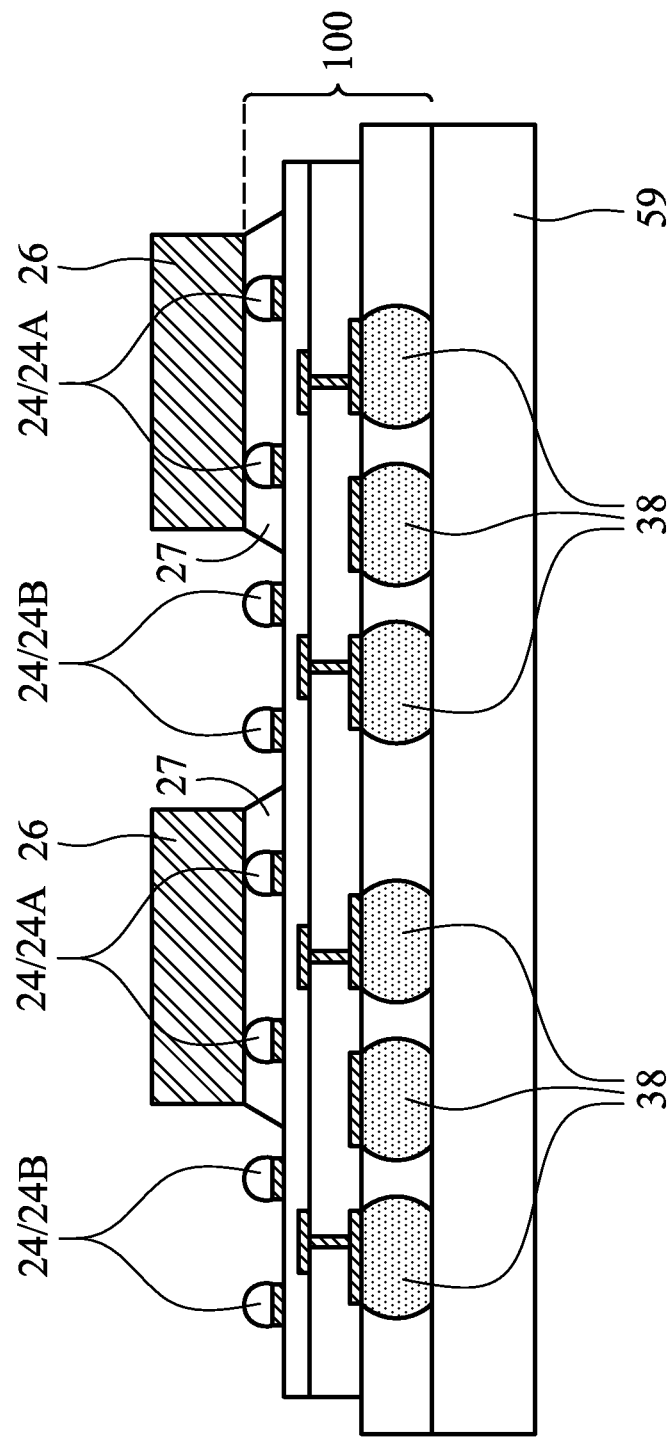
Figure 12:
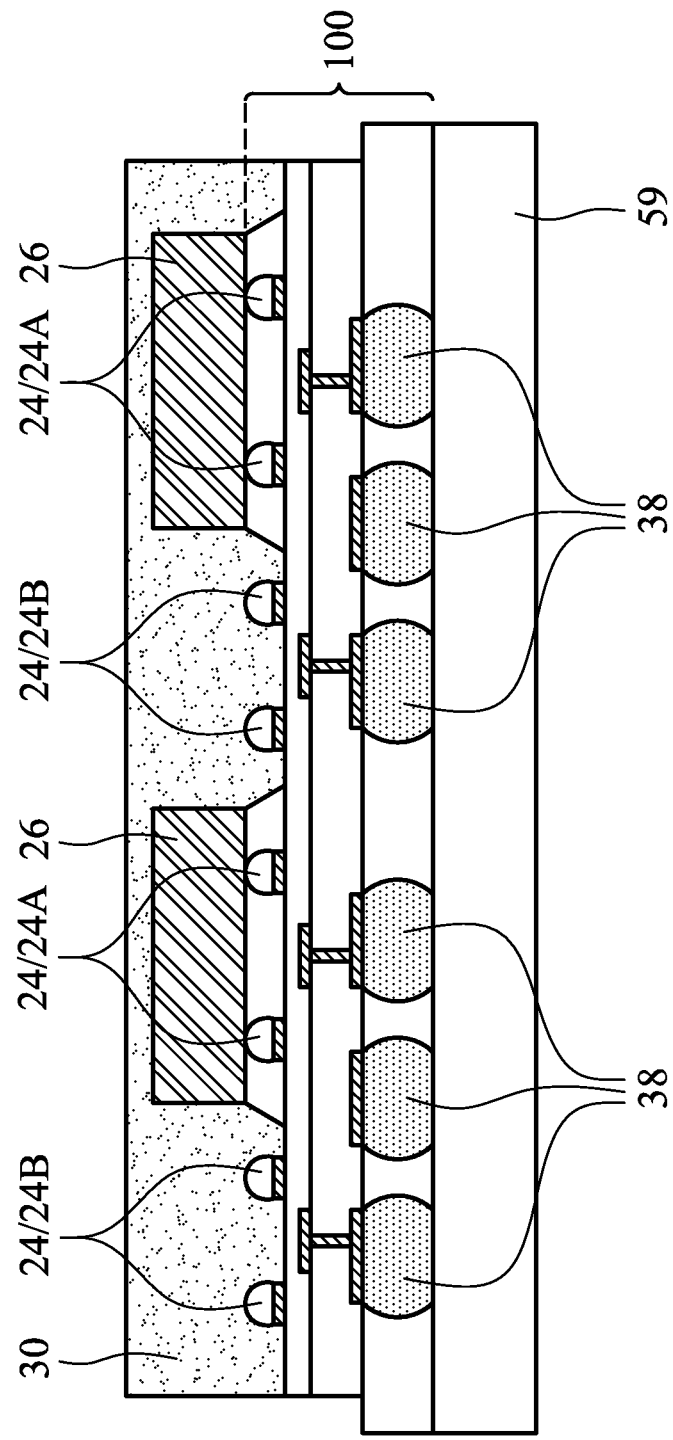

Next, as shown in FIG. 11, dies 26 are bonded to connectors 24A that are on the front side of package component 100. Underfill regions 27 are then dispensed and cured. After the dispensing of underfill regions 27, connectors 24B remain not bonded to any overlying package component, and may be exposed. In FIG. 12, film 30 is applied to cover dies 26 and package component 100. Film 30 may also contact connectors 24B.

Figure 13:
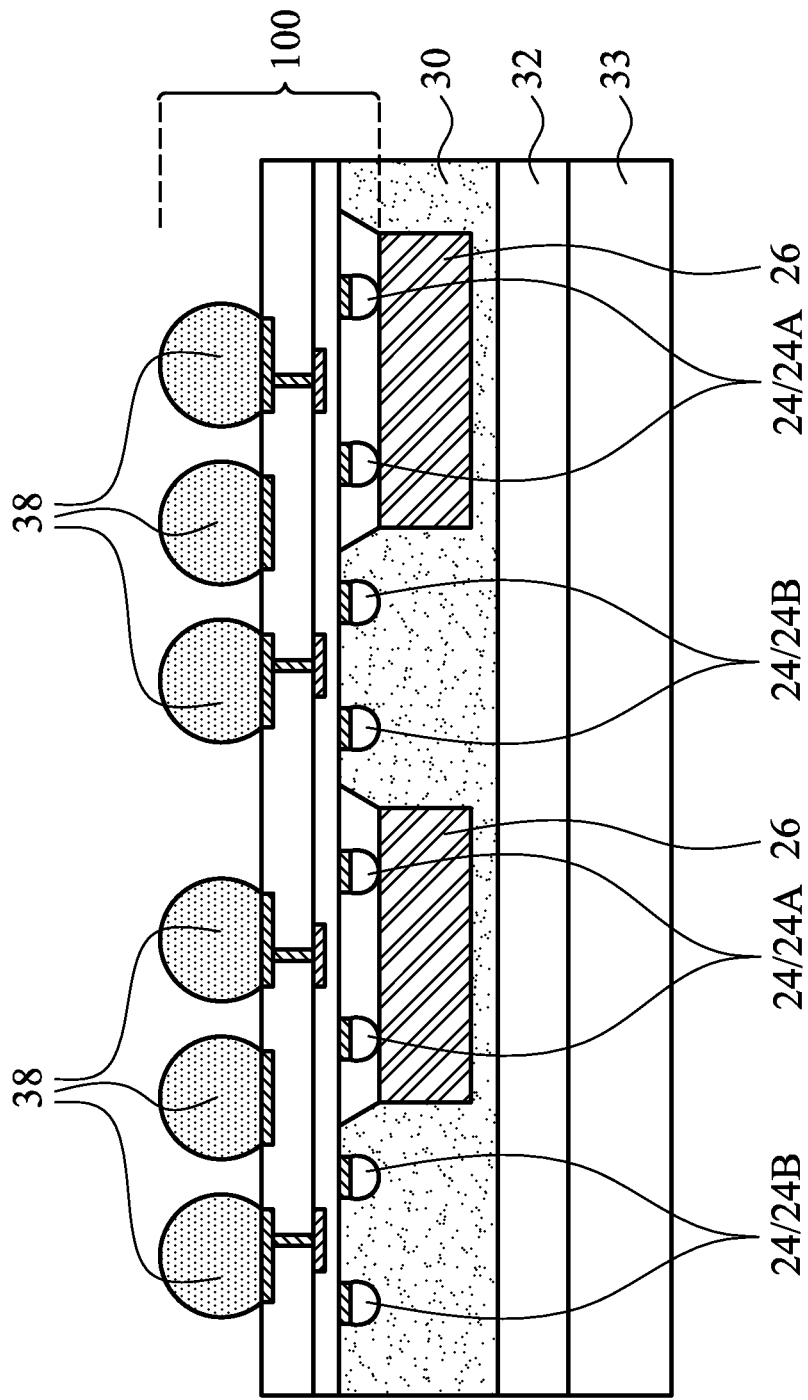
Figure 14:
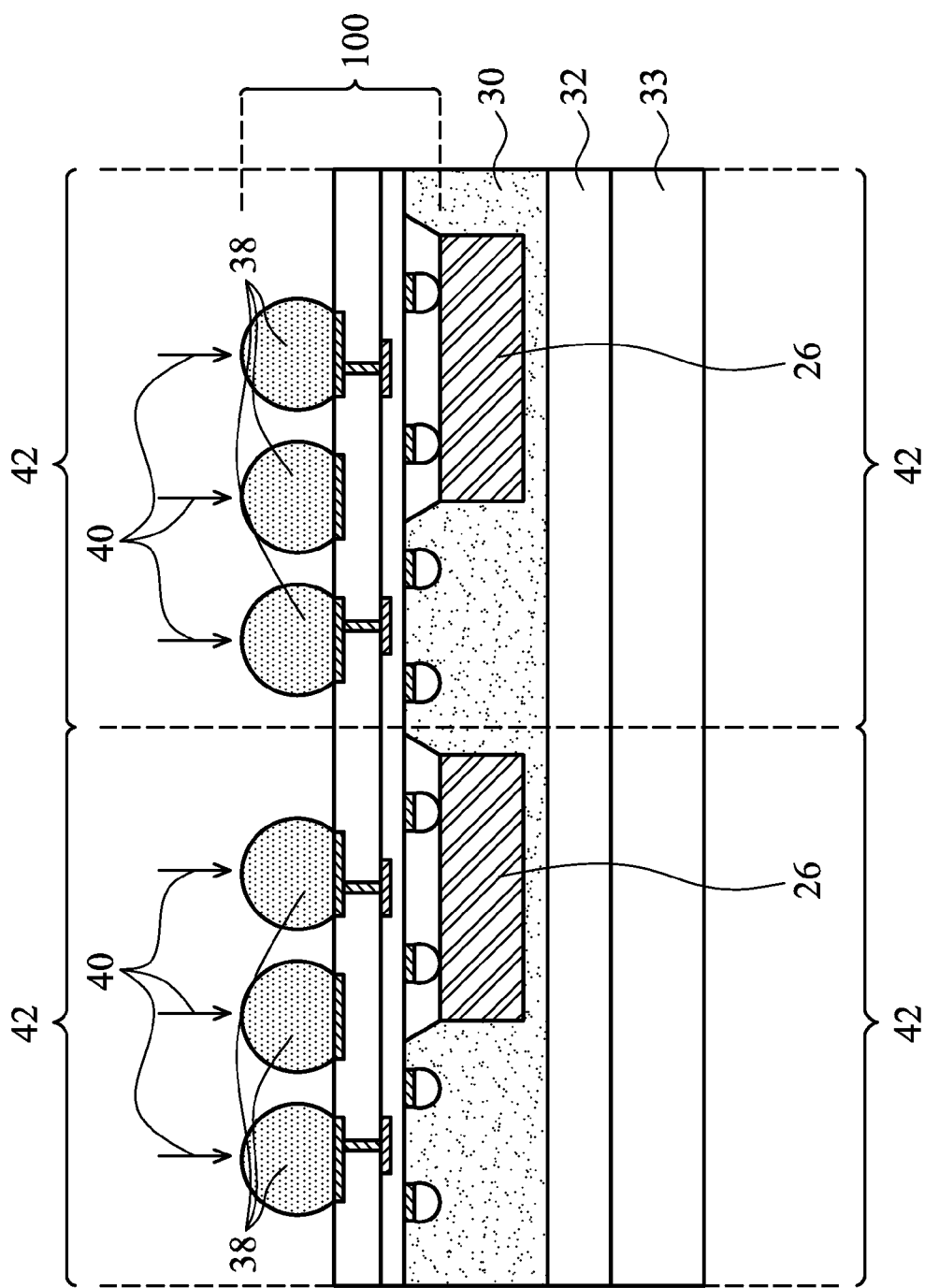

Referring to FIG. 13, film 32 is applied on film 30, and package component 100 is mounted on carrier 33 through film 32. Film 32 may also comprise a polymer. Carrier 59 is then de-bonded, and adhesive 60 is removed. Accordingly, connectors 38 are exposed. Next, as shown in FIG. 14, a chip probing step (symbolized by arrows 40) is performed to detect defective packages 42, with each of packages 42 comprising one of interposers 22 and one of dies 26. With the chip probe step, good packages 42 and defective packages 42 are identified, and are marked.

Figure 15:
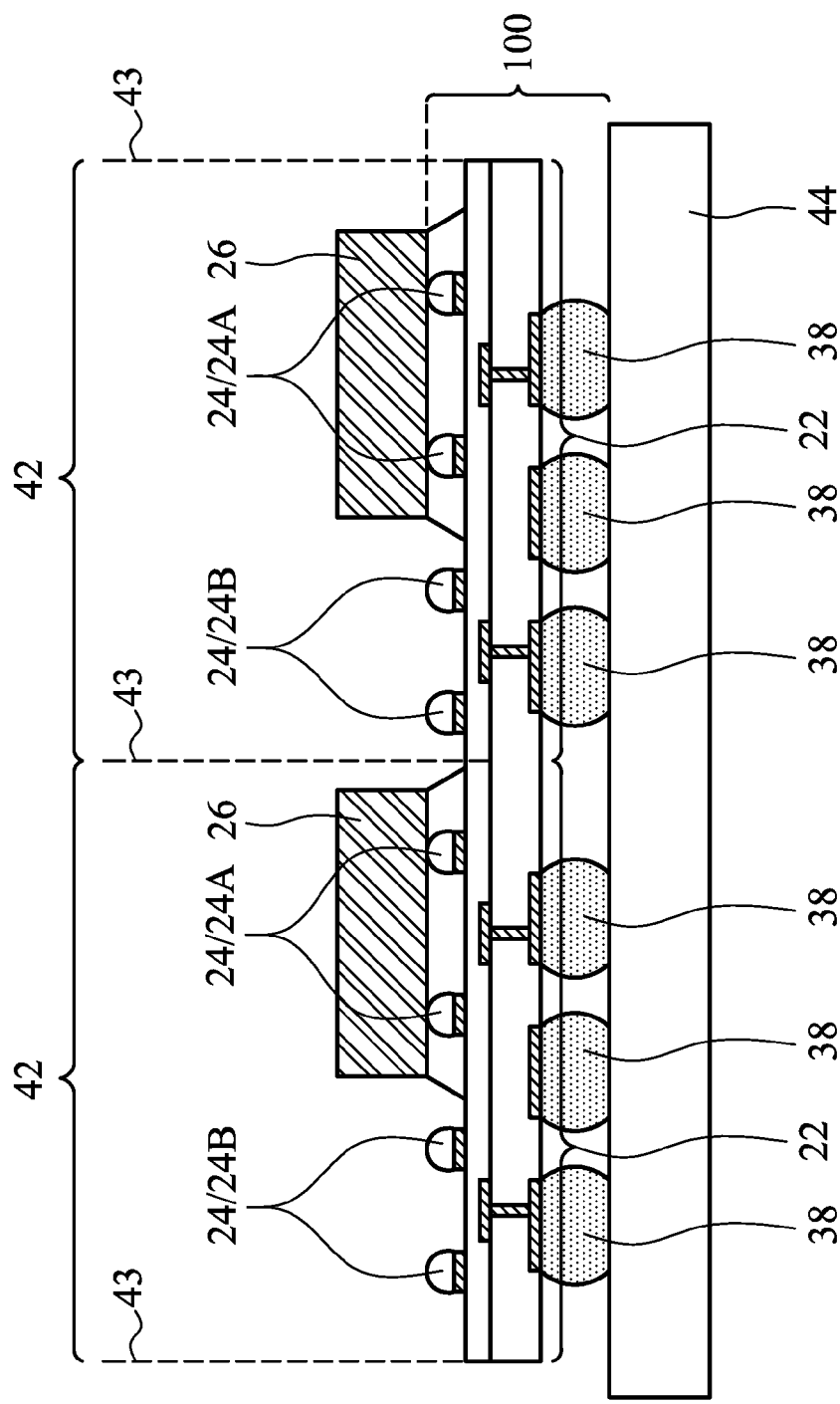
Figure 16:
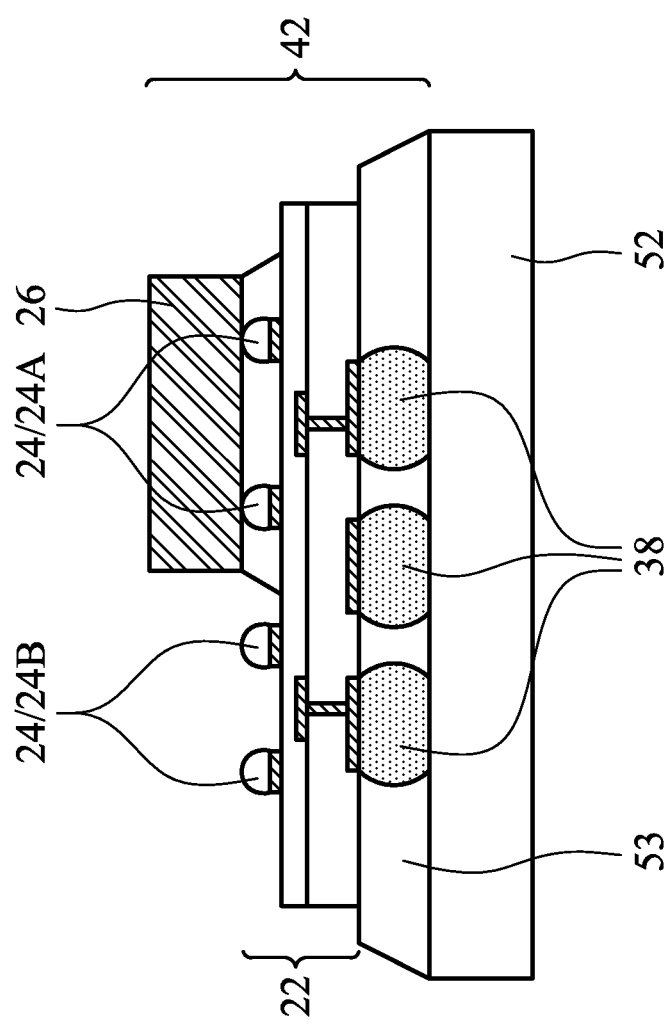

Carrier 33 is then de-bonded. Films 30 and 32 are also removed, for example, through an etching step and a peeling-off step, respectively. The resulting structure is shown in FIG. 15. Connectors 24B are exposed and remain not boned to any overlying package component at this stage. Dicing tape 44 is adhered to the same side of package component 100 as the side connectors 38 are located, and is used to de-bond carrier 33. Next, a dicing step is performed along scribe lines 43 to separate packages 42 from each other. Each of the resulting packages 42 includes one of interposers 22 and one of dies 26. As shown in FIG. 16, the good packages 42 may be bonded to other packaging components (such as package substrate 52) through connectors 38. The defective packages 42 are discarded. Underfill region 53 may then be applied between package component 42 and package component 52.

Figure 17:
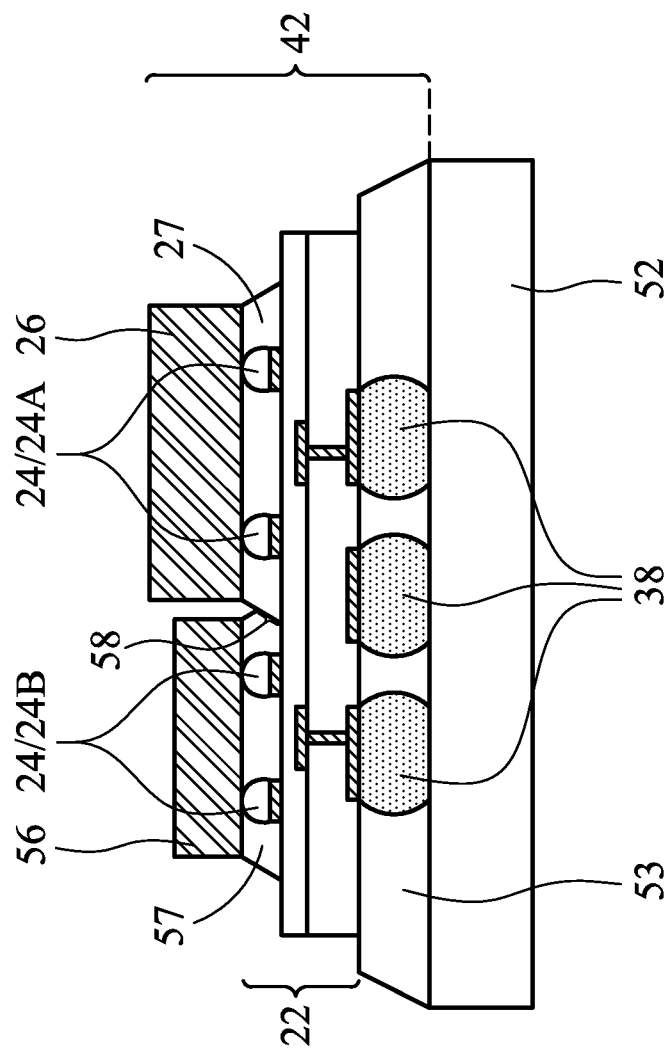

Referring to FIG. 17, package component 56 is bonded to connectors 24B. Package component 56 may be a device die, a package, or the like. Underfill region 57 is then dispensed and then cured. It is realized that underfill regions 57 and 27 are dispensed at different time points. Therefore, regardless of whether underfill regions 57 and 27 are formed of a same material or comprise different materials, visible interface 58 may be formed between underfill regions 57 and 27 when underfill regions 57 and 27 are in contact with each other.

In the exemplary embodiments, the device dies that are to be bonded to the same side of package component 100 are divided into a first group and a second group. The first group of device dies is bonded to package component 100 first to form packages. A chip probing step is performed to find detective packages and good packages from the resulting packages that include the first group of dies. The second group of dies is bonded to the good packages, while the defective packages are not further packaged. Accordingly, the otherwise would-be wasted device dies and package substrates that are to be bonded to the defective packages are saved.

In accordance with embodiments, a method includes bonding a first package component on a first surface of a second package component, and probing the first package component and the second package component from a second surface of the second package component. The step of probing is performed by probing through connectors on the second surface of the second package component. The connectors are coupled to the first package component. After the step of probing, a third package component is bonded on the first surface of the second package component.

In accordance with other embodiments, a method includes bonding a first plurality of dies on a first surface of an interposer wafer to form a plurality of packages, wherein the interposer wafer includes a plurality of interposers. Each of the plurality of packages includes one of the first plurality of dies bonded to one of the plurality of interposers. The plurality of packages is probed from a second surface of the interposer wafer to identify good packages and defective packages. The step of probing is performed by probing through connectors on the second surface of the interposer wafer. The connectors are coupled to the first plurality of dies. After the step of probing, a die-saw is performed to separate the plurality of packages from each other. A second plurality of dies is bonded on the good packages, wherein the defective packages are not bonded with any one of the second plurality of dies.

In accordance with yet other embodiments, a device includes a first package component, a second package component bonded to a first surface of the first package component, and a first underfill region between the first package component and the second package component. The device further includes a third package component bonded to the first surface of the first package component, and a second underfill region between the first package component and the third package component. The first and the second underfill regions join each other to form a continuous underfill region. A visible interface is formed between the first and the second underfill regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    a package substrate;
    a first device die over and bonded to a first surface of the package substrate;
    a first underfill having a portion in a gap between the first device die and the package substrate, wherein the first underfill has a slanted sidewall;
    a second device die over and bonded to the first surface of the package substrate; and
    a second underfill having a portion in a gap between the second device die and the package substrate, wherein boundaries of the first underfill and the second underfill are distinguishable from each other, and the second underfill comprises a portion overlapping the slanted sidewall.

2. The package of claim 1, wherein the first underfill in contact with the second underfill, with a distinguishable interface between the first underfill and the second underfill.

3. The package of claim 1, wherein the first underfill and the second underfill are formed of a same material, and have a distinguishable interface between the first underfill and the second underfill.

4. The package of claim 1, wherein the first underfill and the second underfill are formed of different materials.

5. The package of claim 1, wherein the first device die and the second device die have structures different from each other.

6. The package of claim 1 further comprising solder regions on a second surface of the package substrate, with the first surface and the second surface being opposite to each other.

7. The package of claim 1, wherein the slanted sidewall is neither parallel to nor perpendicular to the first surface of the package substrate.

8. The package of claim 1, wherein the slanted sidewall has a lower portion in contact with the second underfill, and an upper portion spaced apart from the second underfill and the second device die.

9. A package comprising:
    a first package component;
    a second package component bonded to a first surface of the first package component;
    a first underfill region between the first package component and the second package component, wherein the first underfill region has a slanted sidewall;
    a third package component bonded to the first surface of the first package component; and
    a second underfill region between the first package component and the third package component, wherein the first and the second underfill regions join each other to form a continuous underfill region, and the second underfill region comprises a portion overlapping the slanted sidewall.

10. The package of claim 9, wherein the first package component comprises an interposer, and the second package component and the third package component comprise device dies bonded to the interposer.

11. The package of claim 10 further comprising a package substrate bonded to a second surface of the first package component, wherein the package substrate is on an opposite side of the interposer than the second and the third package components.

12. The package of claim 9, wherein the second package component and the third package component comprise different type of dies.

13. The package of claim 9, wherein the second package component is bonded to the first package component through first connectors, the third package component is bonded to the first package component through second connectors, and wherein first and the second connectors have a substantially identical structure.

14. The package of claim 9, wherein the first package component comprises a substrate and through-vias penetrating through the substrate, and the second and the third package components are electrically coupled to the through-vias.

15. The package of claim 9, wherein a visible interface is formed between the first and the second underfill regions, and the visible interface is neither parallel to nor perpendicular to the first surface of the first package component.

16. A package comprising:
 a package substrate;
 a first device die over and bonded to a surface of the package substrate;
 a first underfill comprising a portion in a gap between the first device die and the package substrate;
 a second device die over and bonded to the surface of the package substrate, with the first device die and the second device die having different structures; and
 a second underfill comprising a portion in a gap between the second device die and the package substrate, wherein the first underfill and the second underfill are formed of different materials, and the first underfill and the second underfill form a slant interface neither parallel to nor perpendicular to the surface of the package substrate.

17. The package of claim 16, wherein the first underfill and the second underfill are in physical contact with each other.

18. The package of claim 16, wherein the first underfill and the second underfill have top ends lower than top surfaces of the first device die and the second device die.

* * * * *